United States Patent
Ohba et al.

(10) Patent No.: US 7,012,629 B2
(45) Date of Patent: Mar. 14, 2006

(54) TEMPERATURE COMPENSATING IMAGE RECORDING DEVICE

(75) Inventors: Masahiro Ohba, Kanagawa (JP); Takao Ozaki, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 82 days.

(21) Appl. No.: 10/251,821

(22) Filed: Sep. 23, 2002

(65) Prior Publication Data

US 2003/0058420 A1  Mar. 27, 2003

(30) Foreign Application Priority Data

Sep. 25, 2001 (JP) ............................ 2001-292167
Sep. 27, 2001 (JP) ............................ 2001-297505

(51) Int. Cl.
*B41J 2/435* (2006.01)

(52) U.S. Cl. ...................................... 347/250; 347/235

(58) Field of Classification Search ........ 347/234–235, 347/248–250, 262, 264, 8, 14, 17, 37; 355/70; 318/696; 101/401.1
See application file for complete search history.

(56) References Cited

U.S. PATENT DOCUMENTS 4,678,979 A * 7/1987 Hori ........................ 318/696
5,511,477 A * 4/1996 Adler et al. .............. 101/401.1
5,748,225 A * 5/1998 Ziph-Schatzberg .......... 347/262
5,973,717 A * 10/1999 Kerr et al. .................. 347/234
5,978,010 A * 11/1999 Hosokawa .................. 347/250
5,988,784 A * 11/1999 Takemura et al. ............. 347/8
6,448,996 B1 * 9/2002 Suganuma ................. 347/248
2002/0180944 A1 * 12/2002 Fuji et al. ..................... 355/70

FOREIGN PATENT DOCUMENTS

EP        0 884 197 A1 * 12/1998
JP        01011854 A   *  1/1989
JP        2000162522 A *  6/2000

\* cited by examiner

*Primary Examiner*—Hai Pham
(74) *Attorney, Agent, or Firm*—Sughrue Mion, PLLC

(57) ABSTRACT

An image recording device, wherein deviation of an image-recording start position, which results from a difference in the amount of expansion and contraction based on temperature changes between a printing plate precursor, a rotating support, a mechanism for moving a recording head, and the like, is corrected so that an image can be recorded at a proper position. Temperature 1 near the rotating support is obtained by a first temperature sensor, and temperature 2 near the mechanism is obtained by a second temperature sensor. Then, an amount for correcting an image-recording start position is obtained from a correction table based on the temperatures 1 and 2 and on a size of the printing plate precursor, and the number of drive pulses for correction corresponding to the obtained amount of correction is outputted to a drive motor of the mechanism.

19 Claims, 10 Drawing Sheets

| TEMPERATURE | $\alpha 1$ | $\alpha 2$ | ... | $\alpha n-1$ | $\alpha n$ |
|---|---|---|---|---|---|
| AMOUNT OF VARIATION | $\Delta \alpha 1$ | $\Delta \alpha 2$ | ... | $\Delta \alpha n-1$ | $\Delta \alpha n$ |

| TEMPERATURE | $\beta 1$ | $\beta 2$ | ... | $\beta n-1$ | $\beta n$ |
|---|---|---|---|---|---|
| AMOUNT OF VARIATION | $\Delta \beta 1$ | $\Delta \beta 2$ | ... | $\Delta \beta n-1$ | $\Delta \beta n$ |

TEMPERATURE COMPENSATING IMAGE RECORDING DEVICE

BACKGROUND OF THE INVENTION

1. Field of the Invention

The present invention relates to an image recording device, in which, while a printing plate precursor wound around a peripheral surface of a rotating support is being rotated, a recording head is moved in an axial direction of the rotating support, so as to scan-record an image.

2. Description of the Related Art

In recent years, technology has been developed for printing plate precursors in an exposure device for directly recording an image using a laser beam or the like on a sheet-type recording material, especially on a photosensitive layer (emulsion surface) on a support of a printing plate precursor. This technology has enabled rapid image-recording on a printing plate precursor.

In an automatic exposure device which uses image-recording technology on a printing plate precursor, a rotary drum, around whose peripheral surface a printing plate precursor is wound, is rapidly rotated (main scanning) while a recording head (exposure head) is moved in an axial direction of the rotary drum (sub-scanning). Images are thus recorded onto printing plate precursors.

The recording head is generally moved using a ball screw mechanism. The ball screw mechanism comprises a shaft having a threaded outer surface, and a moving block into which the shaft is screwed and which is prevented from rotating axially. The recording head is mounted on a fixed stage to the moving block, and thus moved.

The ball screw mechanism, the rotary drum and the printing plate precursor expand or contract due to temperature changes in the device. When a material of components of the ball screw mechanism differs from that of the rotary drum and/or the support of the printing plate precursor, the materials have coefficients of thermal expansion, which are different from each other; thus, the amounts of expansion/contraction due to temperature changes are different from each other. Accordingly, a problem arises in that the relative positions between the ball screw mechanism and the printing plate precursor deviate from each other, whereby an image-recording start position in the sub-scanning direction is deviated from, resulting in an improperly formed image.

A moving speed of the recording head during driving is changed with the thermal expansion of the shaft of the ball screw mechanism, and thus, a size of the printing plate precursor also changes. When the material of the shaft differs from that of the rotary drum and/or the support of the printing plate precursor, the materials have coefficients of thermal expansion, which are different from each other, and thus, a scale of an image during recording changes, resulting in an improperly formed image.

The recording positions must have no deviations, especially when the image is in color where such deviations become even more noticeable. For example, when colors are recorded on a printing plate precursor (i.e., C (cyan), M (magenta), Y (yellow) and K (black)), the four colors are recorded separately on respective printing plate precursors. Degraded accuracy of registration is thus a large factor in causing image deviations.

When the device is activated at a low temperature (i.e., with no warm-up, hereafter referred to as "cold"), the temperatures of each section in the device tend to differ from each other considerably. Accordingly, another problem arises in that when the device is activated, especially cold, a relative amount of deviation between a position of the ball screw mechanism and that of the printing plate precursor increases, and thus, a difference between a scale change of the ball screw mechanism and that of the printing plate precursor increases, resulting in the accuracy of registration being considerably degraded.

SUMMARY OF THE INVENTION

The present invention was devised in order to solve the above problems. It is an object of the present invention to provide an image recording device, wherein deviation of an image-recording start position, which results from a difference in the amount of expansion and contraction between a printing plate precursor, a rotating support, a mechanism for moving a recording head, and the like, is corrected so that an image can be recorded at a proper position.

It is another object of the present invention to provide an image recording device, wherein it is possible to correct variations in image-formation scale so that image-formation can be properly performed.

In order to solve the above problems, a first aspect of the present invention is an image recording device comprising: a printing plate precursor; a rotating support including a peripheral surface around which the printing plate precursor is wound; a recording head disposed adjacent to the peripheral surface of the rotating support, the recording head moving parallel to an axial direction of the rotating support during rotation of the rotating support and scanning the printing plate precursor to thereby record an image on the printing plate precursor; a driving mechanism for moving the recording head; at least one temperature sensor; and correction means for correcting an image-recording start position of the recording head based on output from the temperature sensor.

The at least one temperature sensor may comprise a first temperature sensor and a second temperature sensor, with the first temperature sensor measuring a temperature of the printing plate precursor and the second temperature sensor measuring a temperature of the driving mechanism.

The image recording device may further comprise store means for storing as a correction table, data that represents amounts of correction of the image-recording start position of the recording head corresponding to output from the first temperature sensor and the second temperature sensor. The correction table stores data that represents amounts of correction of the image-recording start position of the recording head per size of the printing plate precursor.

The driving mechanism can include a shaft disposed parallel to the axial direction of the rotating support for allowing the recording head to be moved along the shaft. The shaft includes an externally threaded peripheral surface, and the driving mechanism further includes a moving block, into which the shaft is screwed to prevent axial rotation of the moving block, and a support connected to the moving block to support the recording head. The at least one temperature sensor is disposed on the moving block to measure the temperature of the driving mechanism. The correction via the correction means is determined based on the amount of deviation of the shaft and the printing plate precursor from the predetermined image-recording start position in the axial direction of the rotating support due to temperature changes.

Driving of the image recording device increases its temperature, thus causing thermal expansion in the printing plate precursor, the rotating support and the shaft. As a result, deviation arises in the image-recording start position on the printing plate precursor. In the first aspect of the present invention, the first temperature sensor measures a temperature near the printing plate precursor, and the second temperature sensor measures a temperature near the driving mechanism. The correction table includes pre-stored data that represents the amounts of correction of the image-recording start position corresponding to outputs from the first and second temperature sensors, and sizes of the printing plate precursor. The correction means obtains an amount of correction from the correction table correspondingly based on the outputs from the first and second temperature sensors and on the size of the printing plate precursor, so as to correct the image-recording start position.

In accordance with the first aspect of the present invention, temperatures are detected at two positions, one near the printing plate precursor and the other near the driving mechanism. Therefore, even when the temperatures of each section in the image recording device differ from each other, the image-recording start position can be corrected in relation to the amounts of deviation due to thermal expansion caused by the respective temperatures. The image-recording start position can be properly corrected even further by using amounts of correction per size of the printing plate precursor.

A second aspect of the present invention is an image recording device comprising: a printing plate precursor; a rotating support including a peripheral surface around which the printing plate precursor is wound; a recording head disposed adjacent to the peripheral surface of the rotating support, the recording head moving parallel to an axial direction of the rotating support during rotation of the rotating support and scanning the printing plate precursor to thereby record an image on the printing plate precursor; a driving mechanism for moving the recording head; at least one temperature sensor; and adjustment means for adjusting moving speed of the recording head based on output from the temperature sensor. The driving mechanism may include a shaft disposed parallel to the axial direction of the rotating support for allowing the recording head to be moved along the shaft.

The at least one temperature sensor may comprise a first temperature sensor and a second temperature sensor, with the first temperature sensor measuring a temperature of the printing plate precursor and the second temperature sensor measuring a temperature of the shaft. The image recording device preferably further comprises store means for storing as variation tables, amounts of variations in the length of the shaft and in the dimension of the printing plate precursor corresponding to temperature changes. The driving mechanism may include a drive motor for rotating the shaft to move the recording head, and the variation tables may further store data that represents the revolution speed of the drive motor to be corrected in correspondence to differences between the amounts of variations in the length of the shaft and in the dimension of the printing plate precursor.

The adjustment means adjusts the moving speed of the recording head based on amounts of variations obtained from the variation tables so as to correct deviation in recording scale.

The adjustment means can calculate respective rates of variations in the printing plate precursor and in the shaft based on the amounts of variations obtained from the variation tables, and adjust the moving speed of the recording head so that the moving speed has a value obtained by multiplying a difference between rates of variations in the dimension of the printing plate precursor and in the length of the shaft by a pre-adjusted moving speed of the recording head.

The shaft may include an externally threaded peripheral surface, and the driving mechanism may further include a moving block, into which the shaft is screwed to prevent axial rotation of the moving block, and a support connected to the moving block to support the recording head. Further, the at least one temperature sensor may be disposed on the moving block to measure the temperature of the shaft.

Driving of the image recording device increases its temperature, thus causing thermal expansion in the printing plate precursor, the rotating support and the shaft. As a result, the size of the printing plate precursor enlarges and the shaft lengthens. In general, the materials that make up the printing plate precursor and the shaft are different from each other, and thus, coefficients of thermal expansion also differ. Therefore, when the recording head is moved at a speed used before thermal expansion occurs, the image cannot be properly formed because it does not correspond to the enlarged printing plate precursor. In cases where the device is activated, especially cold, the temperatures of each section in the device are considerably different from each other, and thus, the temperatures of the printing plate precursor and the shaft are also different from each other. In the present invention, the first temperature sensor measures a temperature near the printing plate precursor, and the second temperature sensor measures a temperature near the driving mechanism. The tables for amounts of size/pitch variations include pre-stored amounts of size variation of the printing plate precursor and amounts of pitch variation of the shaft corresponding to temperature changes. The amount of size variation of the printing plate precursor corresponding to the output from the first temperature sensor, and the amount of pitch variation of the shaft corresponding to the output from the second temperature sensor are obtained from the variation tables by the adjustment means; the moving speed of the recording head is adjusted based on the obtained amounts of variations so as to correct any deviation in recording scale due to variations in the dimension of the printing plate precursor and in the length of the shaft.

In accordance with the second aspect of the present invention, temperatures are detected at two positions, one near the printing plate precursor and the other near the driving mechanism, and the moving speed of the recording head is adjusted based on the amount of size variation of the printing plate precursor corresponding to the detected temperature near the printing plate precursor, and on the amount of pitch variation of the shaft corresponding to the detected temperature near the shaft. Therefore, an image can be properly formed in correlation to differences in image scale due to thermal expansion of the printing plate precursor and the shaft, and, even when the temperatures of each section in the image recording device are different from each other, the moving speed of the recording head can be properly adjusted to respond to the respective temperatures.

BRIEF DESCRIPTION OF THE DRAWINGS

FIG. 7A is an example of a table for amounts of size variation in a second embodiment of the present invention.

FIG. 7B is an example of a table for amounts of pitch variation in the second embodiment of the present invention.

DESCRIPTION OF THE PREFERRED EMBODIMENTS

Hereinafter, embodiments of an image recording device according to the present invention will be described with reference to the attached drawings.

Figure 1:
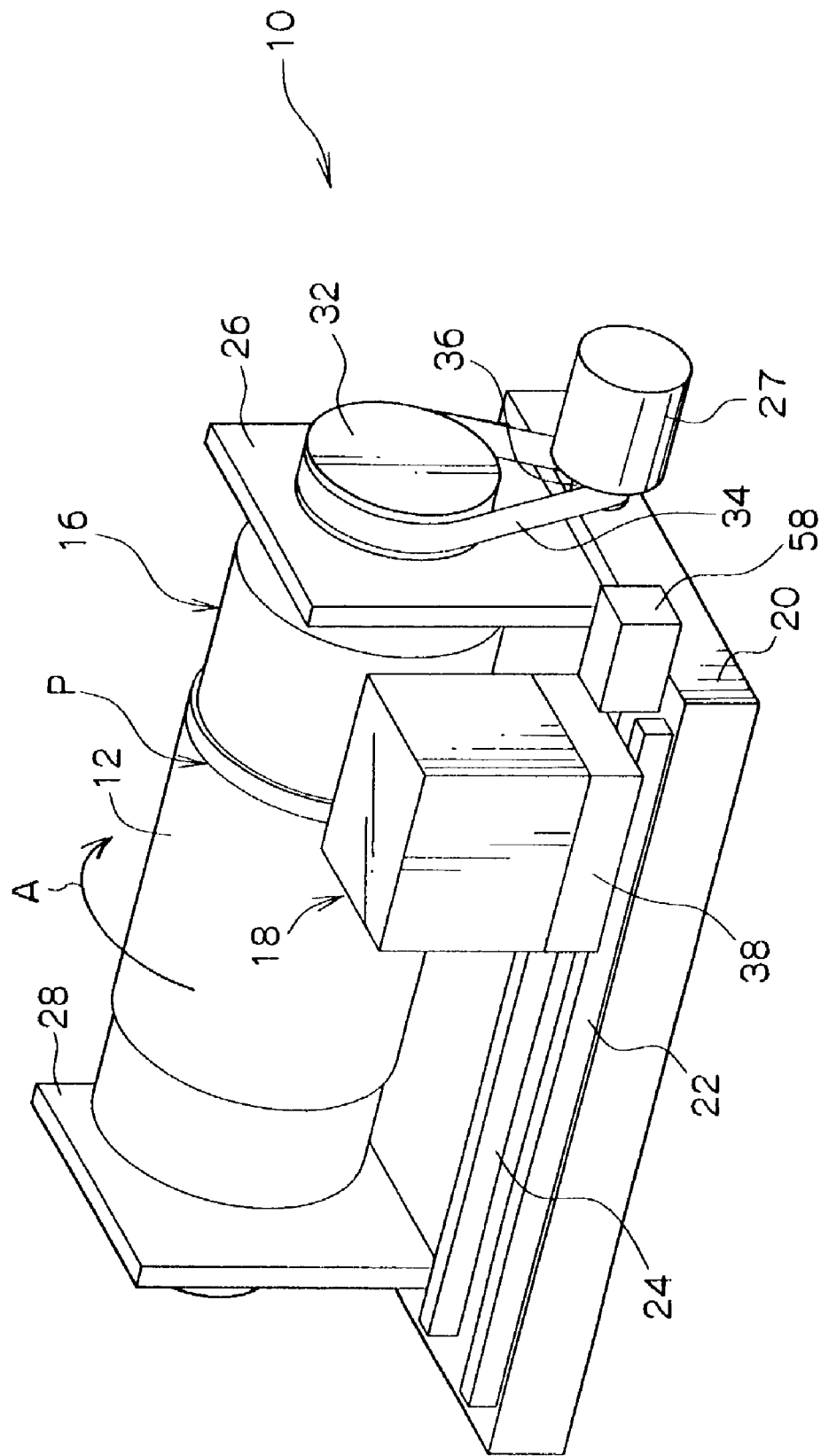
FIG. 1 is a schematic perspective view showing an exposure section of an automatic exposure device for printing plate precursors according to the present invention.
Figure 2:
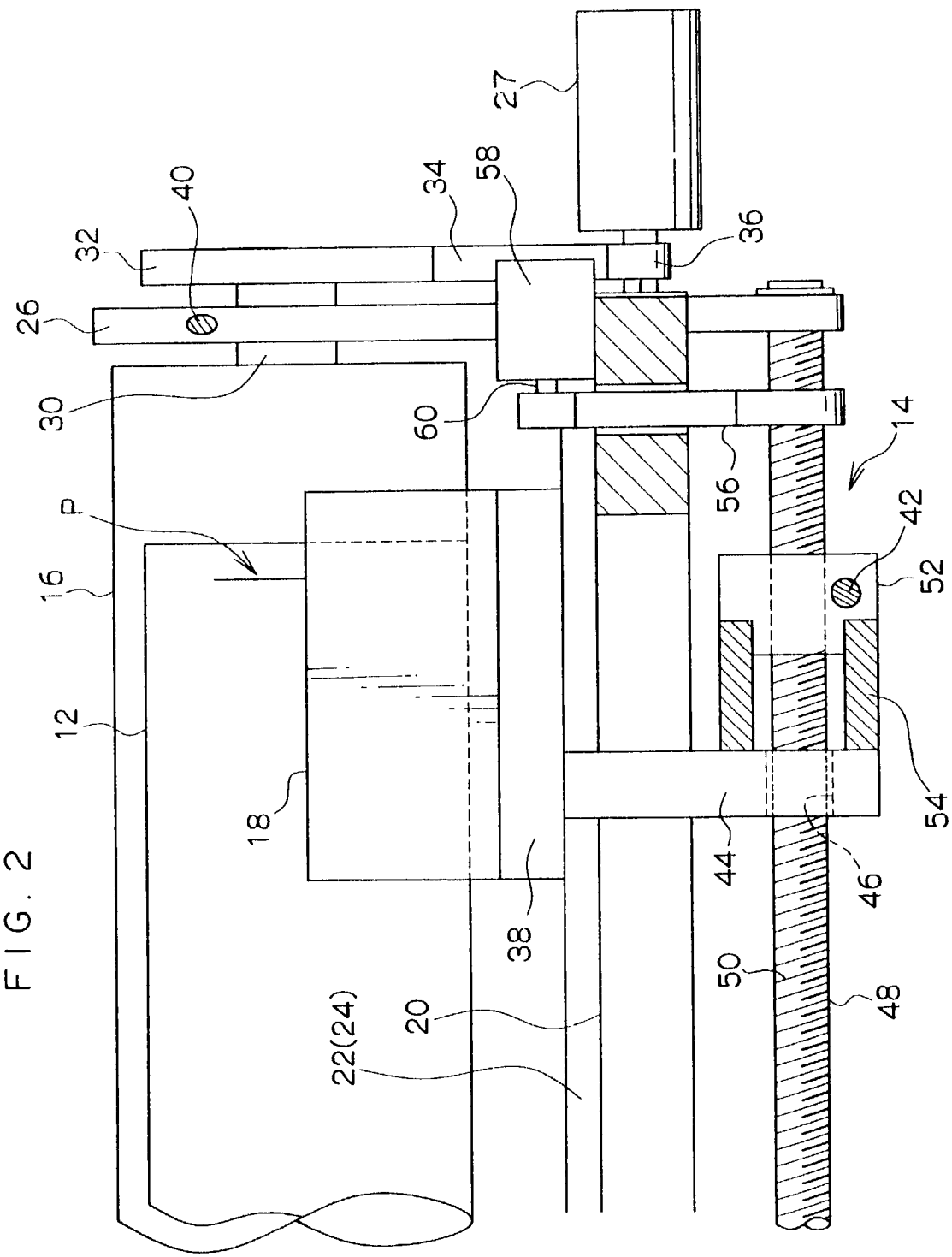
FIG. 2 is a side view showing a ball screw mechanism in the automatic exposure device for printing plate precursors according to the present invention.

FIG. 1 shows an exposure section 10 of an automatic exposure device for printing plate precursors in the embodiments. FIG. 2 shows a ball screw mechanism 14 incorporated in the exposure section 10.

The exposure section 10 mainly comprises a rotary drum 16, around which a printing plate precursor 12 is wound and held, a recording head 18, and the ball screw mechanism 14.

As shown in FIG. 1, a base 20 is disposed to support the entire exposure section 10. A pair of side panels 26 and 28, which are parallel to each other, are mounted on the base 20 and support a rotation axis of the rotary drum 16. A pulley 32 is attached to a portion 30 of the rotation axis protruding from the side panel 26, and a belt 34 is wound around the pulley 32. Further, a drive motor 27 is disposed on the side panel 26 side of the base 20; the belt 34 is wound around a pulley 36 attached to a rotation axis of the drive motor 27. Accordingly, the rotary drum 16 is rotated by a driving force of the drive motor 27.

A pair of rails 22 and 24, which are parallel to each other, are horizontally mounted between the side panels 26 and 28 on the base 20. A sub-scanning stage 38 is loaded on the rails 22 and 24, and the recording head 18 is disposed and supported on the sub-scanning stage 38. The sub-scanning stage 38 is movable along the rails 22 and 24 in an axial direction of the rotary drum 16. While moving in this direction, the sub-scanning stage 38 performs sub-scanning to form an image.

As shown in FIG. 2, a temperature sensor 40 (a first temperature sensor) is disposed on the side panel 26 near the rotary drum 16, and a temperature reading from this position is outputted from the temperature sensor 40 to an unillustrated correction section. The first temperature sensor 40 can be positioned at any place as long as it is near the printing plate precursor 12.

As shown in FIG. 2, a slit is formed through the base 20 between the rails 22 and 24, so that the sub-scanning stage 38 is connected via a head connecting member 44 to the ball screw mechanism 14, which is attached to a rear side (i.e., underside) of the base 20. A hole 46 is formed through the head connecting member 44, and a shaft 48 forming the ball screw mechanism 14 passes through the hole 46 in the axial direction of the rotary drum 16. The shaft 48 has a threaded outer surface 50, and both ends of the shaft 48 are supported by side panels, which are disposed at substantially the same positions as the side panels 26 and 28, with respect to the axial direction of the rotary drum 16.

The shaft 48 having the threaded outer surface 50 is screwed into a moving block 52, and the moving block 52 is attached to the head connecting member 44 via a cylindrical member 54. Accordingly, the moving block 52 can be prevented from rotating and transmit its own movement to the recording head 18 via the head connecting member 44. A temperature sensor 42 (a second temperature sensor) is attached to the moving block 52 and outputs a temperature reading from this position to the unillustrated correction section. The second temperature sensor 42 may be disposed anywhere it is in the vicinity of the ball screw mechanism 14, which serves as the driving mechanism.

One end of the shaft 48 is connected to a rotation axis 60 of a drive motor 58 via a motor connector 56 so that the shaft 48 can be rotated by the driving force of the drive motor 58. When the shaft 48 is rotated, the moving block 52 is moved in an axial direction of the shaft 48, whereby the recording head 18 can be moved in the axial direction of the rotary drum 16.

In the embodiments, for example, steel (iron) can be used as a material for the shaft 48, and aluminum can be used as a material for the printing plate precursor 12. The coefficient of thermal expansion $\alpha 1$ for steel is $1.0 \times 10^{-5}$, while the coefficient of thermal expansion $\alpha 2$ for aluminum is $2.3 \times 10^{-5}$.

A structure of a control system in a first embodiment of the present invention will now be described.

Figure 3:
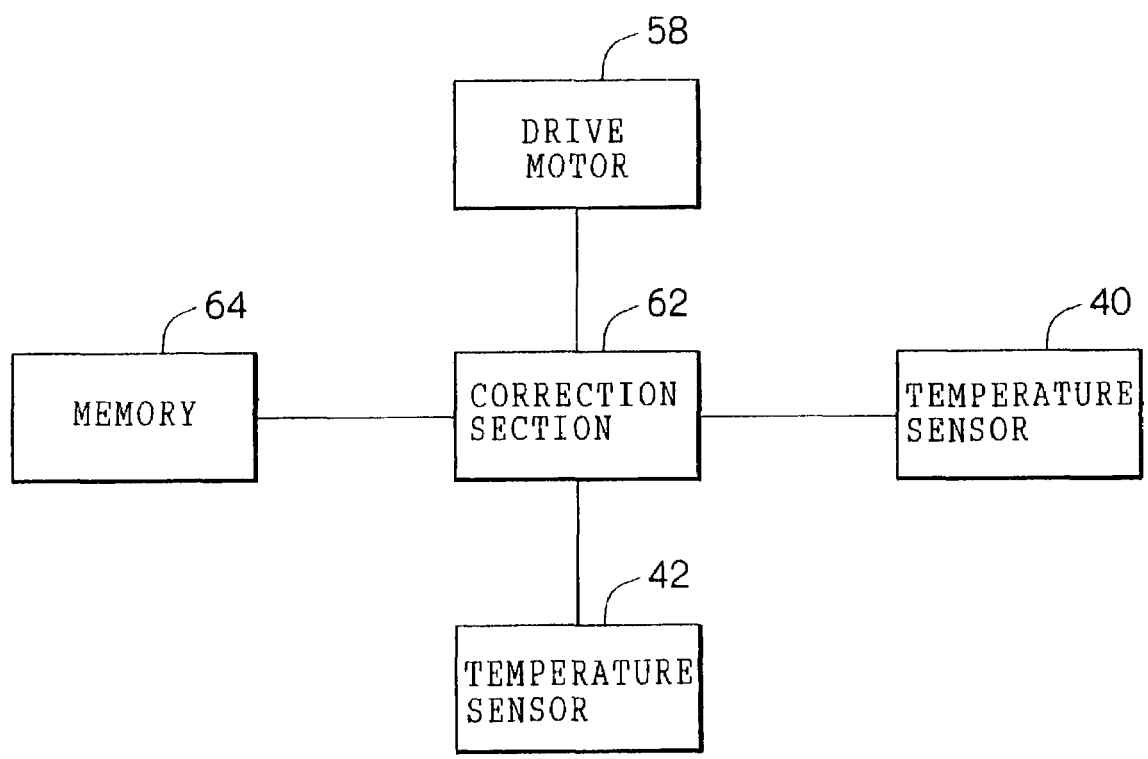
FIG. 3 is a block diagram showing a control system in embodiments of the present invention.

As shown in the block diagram of FIG. 3, the control system in the first embodiment comprises a correction section 62, a memory 64, the drive motor 58, and the temperature sensors 40 and 42. The correction section 62 consists of a microcomputer, which includes a CPU, a ROM and a RAM, that is connected to the memory 64, the drive motor 58, and the temperature sensors 40 and 42.

Figure 4:
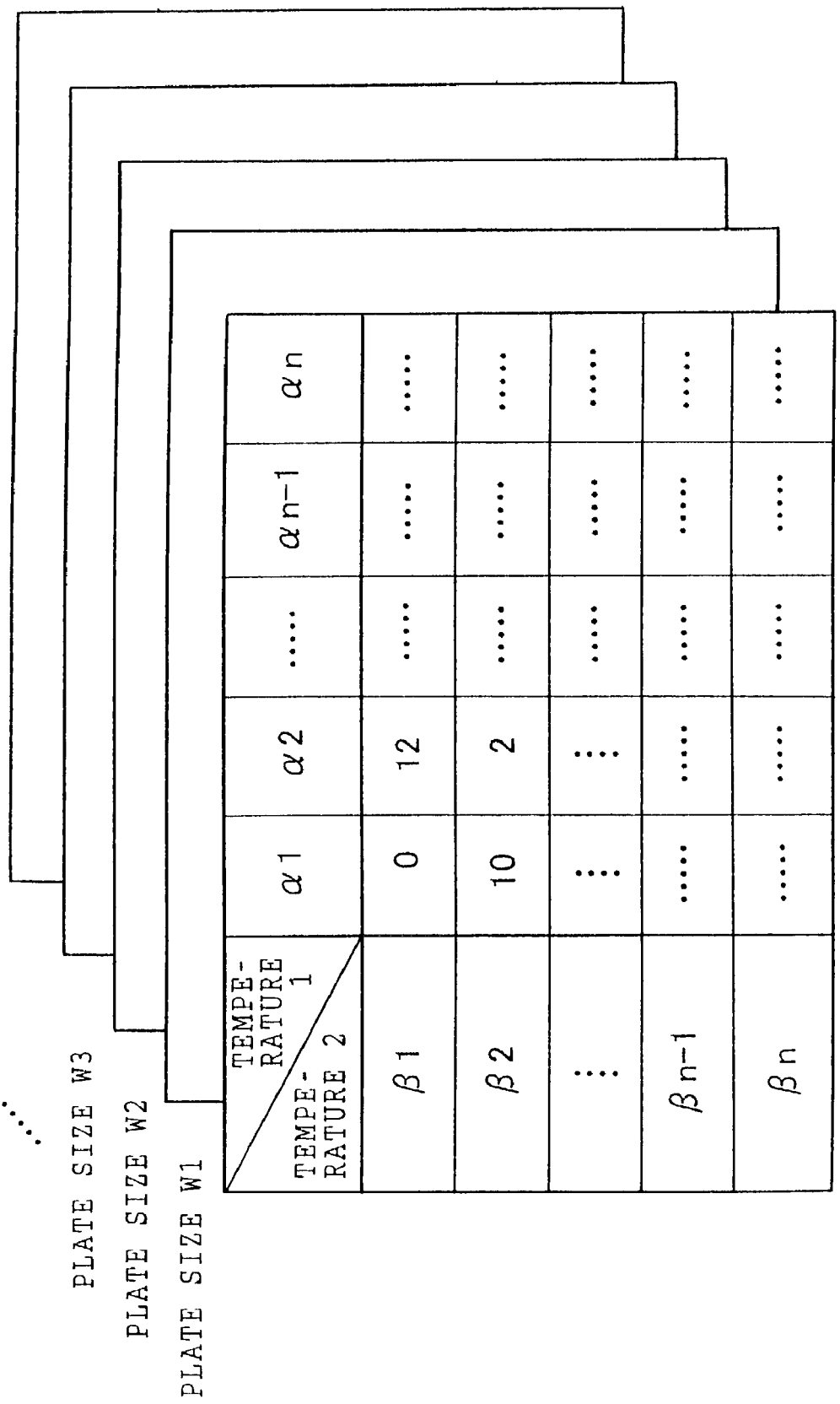
FIG. 4 is an example of a correction table in a first embodiment of the present invention.

The memory 64 stores a correction table 66 including amounts of correction corresponding to respective temperature changes in the printing plate precursor 12, the rotary drum 16 and the shaft 48. The correction table 66 shows the relationship between the temperatures and the amounts of correction, and includes (as shown in FIG. 4) said amounts of correction, i.e., numbers of drive pulses to be applied to the drive motor 58 for correction, corresponding to outputs $\alpha n$ from the temperature sensor 40 detecting temperature 1 near the rotary drum 16 and outputs $\beta n$ from the temperature sensor 42 detecting temperature 2 near the shaft 48. In the example shown in FIG. 4, when the output from the temperature sensor 40 is $\alpha 1$ and the output from the temperature sensor 42 is $\beta 1$, the amount of correction is 0, that is, image-recording can be started from position P without correction (see FIGS. 1 and 2). When the output from the temperature sensor 40 changes to $\alpha 2$, $\alpha 3$, etc., and the output from the temperature sensor 42 changes to $\beta 2$, $\beta 3$, etc., the image-recording start position deviates from the position P by an amount of correction corresponding to the collective outputs from the temperature sensors 40 and 42. Thus, corrections are made for the image-recording start position.

The amount of deviation of the shaft 48 and of the printing plate precursor 12 in a sub-scanning direction due to temperature changes have been detected in advance; based on the relative amounts of deviation between the positions of the shaft 48 and of the printing plate precursor 12, the number of drive pulses necessary so that image-recording starts from the position P is determined and stored in the correction table 66 as the amounts of correction. When an amount of deviation of the shaft 48 in the sub-scanning direction at a certain temperature is ΔS, and an amount of deviation of the printing plate precursor 12 in the sub-scanning direction at a certain temperature is ΔI, the relative amount of deviation between the position of the shaft 48 and that of the printing plate precursor 12 can be obtained by ΔS–ΔI.

Since amounts of deviation of the printing plate precursor 12 due to thermal expansion vary depending upon the size thereof, various amounts of correction per size of the printing plate precursor 12 are stored in the correction table 66.

An operation in the first embodiment will now be explained.

Figure 5:
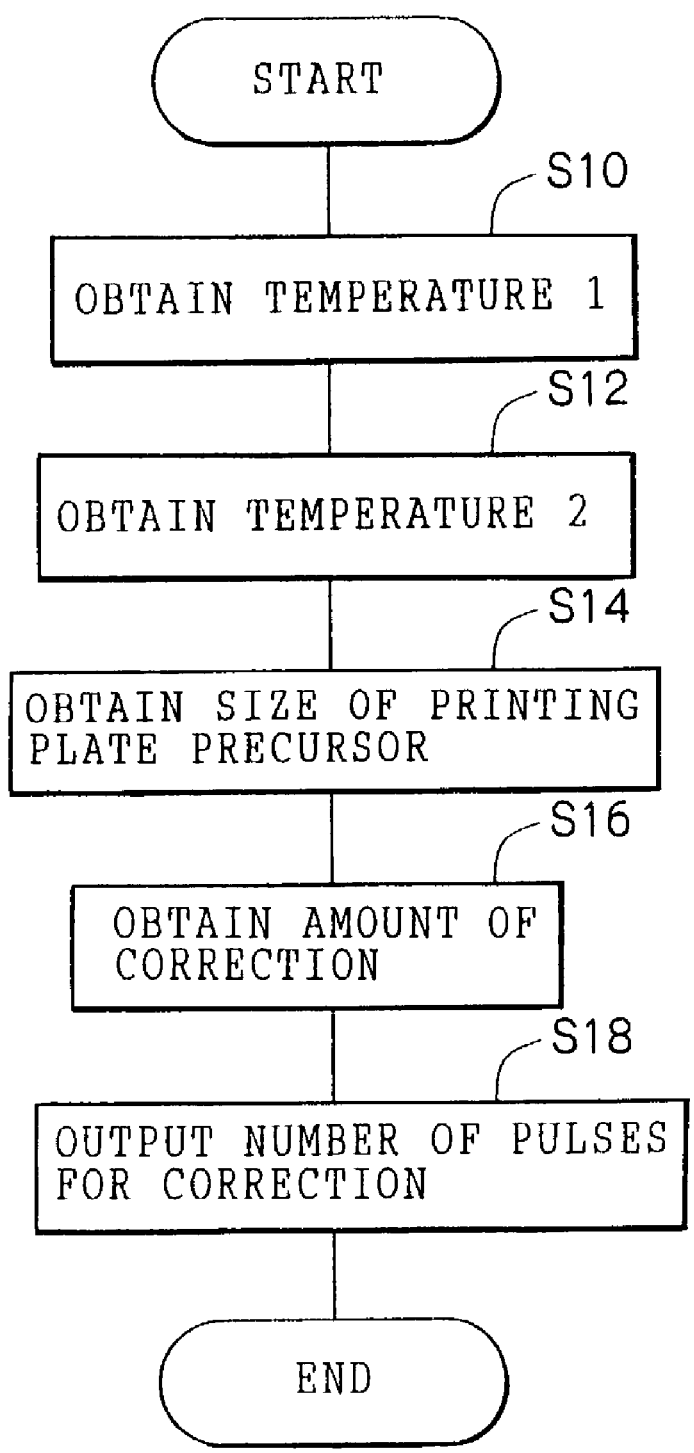
FIG. 5 is a flowchart showing a sequence of a process for detecting an amount of correction in the first embodiment of the present invention.

When a size of the printing plate precursor is inputted from an unillustrated input section to start an exposure process at the exposure device for printing plate precursors, a process for detecting an amount of correction starts in accordance with a flowchart shown in FIG. 5.

In step S10, temperature 1 near the rotary drum 16 is outputted by the temperature sensor 40, and the temperature reading is obtained by the correction section 62. Then, in step S12, temperature 2 near the shaft 48 is outputted by the temperature sensor 42, and the temperature reading is obtained by the correction section 62. The temperatures of each section in the automatic exposure device for printing plate precursors differ considerably from each other, when the device is activated, especially cold. Therefore, the temperature affecting the printing plate precursor 12 is measured as the temperature 1 by the temperature sensor 40, and the temperature affecting the shaft 48 is measured as the temperature 2 by the temperature sensor 42.

In step S14, the inputted size of the printing plate precursor is obtained by the correction section 62. In step S16, an amount for correcting an image-recording start position to the position P is obtained from the correction table 66, based on the obtained temperatures 1 and 2, and on the obtained size of the printing plate precursor. In step S18, the obtained amount of correction, i.e., the number of drive pulses for correction, is outputted to the drive motor 58, and then, the process is ended.

The drive motor 58 adjusts timing of start of image-recording based on the number of drive pulses for correction, which has been outputted from the correction section 62, so as to correct the image-recording start position.

The printing plate precursor 12 is guided by an unillustrated conveyance guide unit, and sent from the tangential direction of the rotary drum 16. The rotary drum 16 is rotated at a predetermined timing by the drive motor 27 in a direction in which the printing plate precursor 12 is attached and exposed (direction of arrow A in FIG. 1). The sent printing plate precursor 12 is tightly wound around the rotary drum 16 by an unillustrated leading-edge chuck and an unillustrated trailing-edge chuck to complete the positioning of the printing plate precursor 12 for exposure. After the printing plate precursor 12 has been completely attached to the rotary drum 16, image data is read, and then, an exposure process is started with a light beam from the recording head 18. The timing of the start of image-recording at this time is adjusted based on the number of drive pulses for correction, which has been outputted from the correction section 62, so as to correct the image-recording start position to the position P.

This exposure process is undertaken while the rotary drum 16 is rotated at high speed (main scanning) and while the recording head 18 is moved in the axial direction of the rotary drum 16 (sub-scanning).

In the first embodiment, amounts of correction for the image-recording start position correspond to combinations of temperatures near the shaft, temperatures near the rotary drum, and sizes of the printing plate precursor, which are stored in advance in the correction table; the temperatures near the rotary drum and the shaft are respectively measured by the temperature sensors 40 and 42. Then, an amount of correction for the image-recording start position is determined by referring to the correction table based on the measured temperatures, as well as on the inputted size of the printing plate precursor, so as to correct the image-recording start position. Accordingly, relative deviation between the image-recording start position of the shaft and that of the printing plate precursor, whose coefficients of thermal expansion are different from each other, can be properly corrected.

A temperature inside the device is not stable, whereby a temperature of the shaft tends to differ from that of the printing plate precursor in cases where the device is activated, especially cold; this tends to increase the relative amount of deviation between the image-recording start position of the shaft and that of the printing plate precursor. In the first embodiment, however, the temperatures near the shaft and the printing plate precursor are respectively measured, and corrections are made corresponding to the measured temperatures, whereby relative deviation between the image-recording start position of the shaft and that of the printing plate precursor, which is caused when the device is activated, especially cold, can be properly corrected, and thus, accuracy of registration can be improved.

Furthermore, amounts of correction per size of the printing plate precursor are stored in the correction table, and the amount of correction performed corresponds to the size of the printing plate precursor, so the image-recording start position can be corrected more accurately.

In the first embodiment, an outer-drum type of rotary drum 16 is used as a rotating support. The same effects can be achieved, however, when an inner-drum type thereof is used as a rotating support.

In accordance with the above-described first embodiment of the present invention, amounts of correction correspond to the temperatures near the shaft, temperatures near the rotary drum, and sizes of the printing plate precursor, which are stored in advance in the correction table; the temperatures near the rotary drum and the shaft are respectively measured by the temperature sensors 40 and 42. Then, the image-recording start position is corrected by referring to the correction table based on the measured temperatures, as well as on the inputted size of the printing plate precursor. Accordingly, it has the excellent effect in that the image-recording start position can be properly corrected in respect to the relative deviation between the position of the shaft and that of the printing plate precursor due to temperature differences therebetween.

Further, the amount of correction performed is selected from amounts of correction per size of the printing plate precursor, which are stored in the correction table. Accordingly, it has the excellent effect in that the image-recording start position can be corrected more properly.

In the first embodiment, the image-recording start position is corrected by referring to the correction table, which has been prepared based on outputs from the temperature sensors 40 and 42. The image-recording start position of the recording head, however, can be also obtained by the following calculation.

Figure 6:
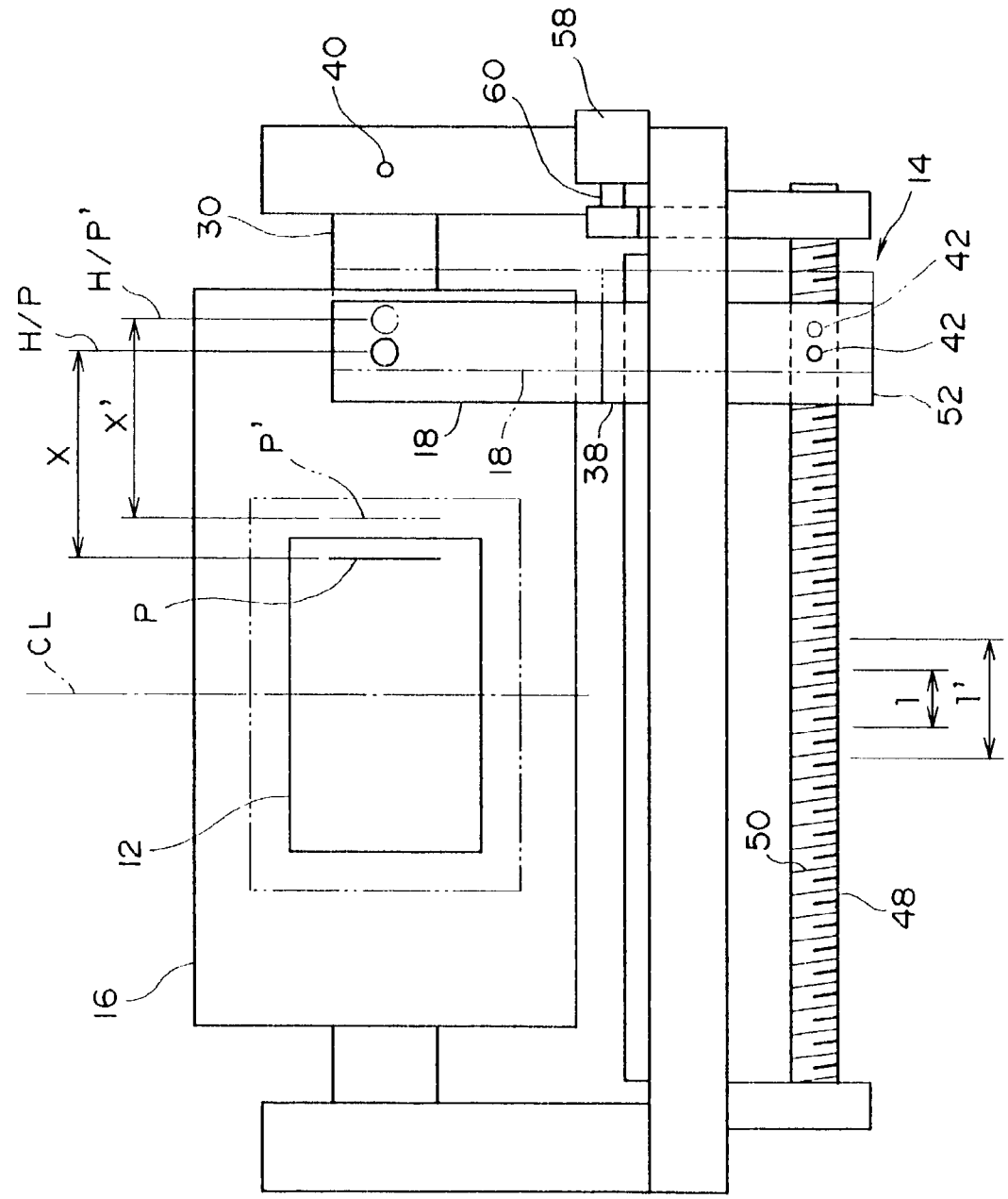
FIG. 6 is a side view showing the automatic exposure device for printing plate precursors, indicating image-recording start positions before and after thermal expansion.

As shown in FIG. 6, when, before thermal expansion, an image-recording start position of the printing plate precursor 12 is P, a home position of the recording head 18 is H/P, and a distance over which the recording head 18 is moved via one revolution of the ball screw mechanism 14 (ball screw lead) is l; when, after thermal expansion, an image-recording start position of the printing plate precursor 12 is P', a home position of the recording head 18 is H/P', and a distance over which the recording head 18 is moved via one revolution of the ball screw mechanism 14 (ball screw lead) is l'; and when a center line CL of the printing plate precursor 12 (which bisects the plate into equal halves) is used as a reference line, a distance from P to P' and a distance from H/P to H/P' can be obtained by using the following formulas:

$$P \text{ to } P' = \text{plate size}/2 \times 1.0 \times 10^{-5} \times T\alpha \times \text{correction factor 1}$$

$$H/P \text{ to } H/P' = (CL \text{ to } H/P) \times 1.0 \times 10^{-5} \times T\alpha \times \text{correction factor 2}$$

wherein, $T\alpha$ is a temperature measured by the temperature sensor 40, and correction factors 1 and 2 are factors inherent in the printing plate precursor 12.

Thus, when an amount of movement from H/P to P is X, and an amount of movement from H/P' to P' is X', the amount of movement X' and the ball screw lead l' can be obtained by using the following formulas:

$$X' = X + (H/P \text{ to } H/P') - (P \text{ to } P')$$

$$l' = l + l \times 1.0 \times 10^{-5} \times T\beta \times \text{correction factor 3}$$

wherein, $T\beta$ is a temperature measured by the temperature sensor 42, and correction factor 3 is a factor inherent in the ball screw mechanism 14.

After thermal expansion, the recording head 18 moves over the distance X' from H/P' to P', and starts to record an image. When the number of drive pulses to be supplied to the drive motor 58 at this time is X'Pu, X'Pu can be obtained by using the following formula:

$$X'Pu = \frac{X'}{l'} \times \text{number of pulses for one revolution of ball screw}$$

A structure of a control system in a second embodiment of the present invention will now be described by again referring to FIG. 3.

As shown in the block diagram of FIG. 3, the control system in the second embodiment comprises the correction section 62, the memory 64, the drive motor 58, and the temperature sensors 40 and 42. The correction section 62 consists of a microcomputer, which includes a CPU, a ROM and a RAM, that is connected to the memory 64, the drive motor 58, and the temperature sensors 40 and 42.

The memory 64 stores a table for amounts of size variation 660, where amounts of size variation due to temperature change of the printing plate precursor 12 are included. The memory 64 also stores a table for amounts of pitch variation 670, where amounts of pitch variation due to temperature change of the shaft 48 are included.

As shown in FIG. 7A, the table for amounts of size variation 660 stores amounts of size variation $\Delta\alpha 1$, $\Delta\alpha 2$, ... and $\Delta\alpha n$ respectively corresponding to temperatures $\alpha 1$, $\alpha 2$, ... and $\alpha n$. As shown in FIG. 7B, the table for amounts of pitch variation 670 stores amounts of pitch variation $\Delta\beta 1$, $\Delta\beta 2$, ... and $\Delta\beta n$ respectively corresponding to temperatures $\beta 1$, $\beta 2$, ... and $\beta n$.

In each device, amounts of size variation of the printing plate precursor 12 and of pitch variation of the shaft 48 due to temperature changes are detected in advance, and respectively stored in the table for amounts of size variation 660 and in the table for amounts of pitch variation 670.

Figure 8:
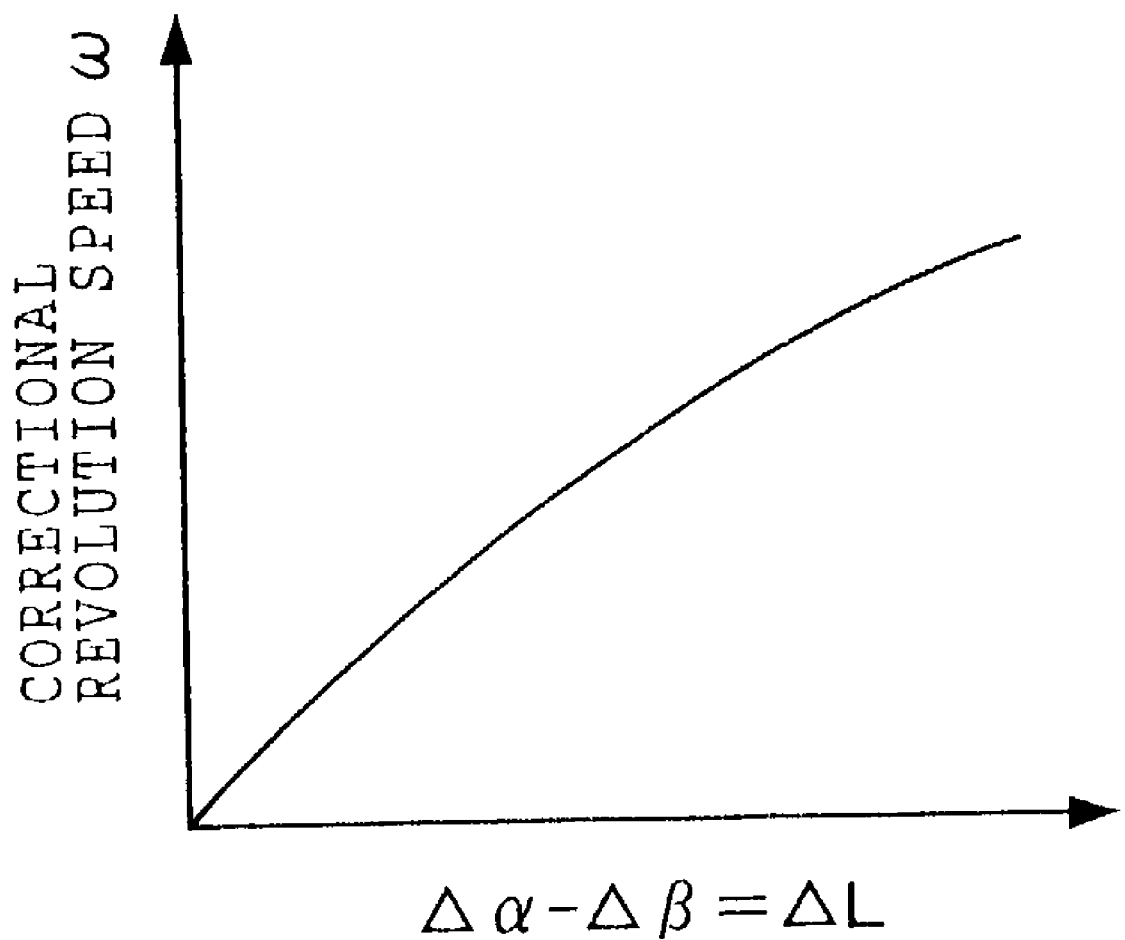
FIG. 8 is a graph showing the relationship between correctional revolution speed of a motor and differences in amounts of size and pitch variations.

As shown in FIG. 8, data is stored in the correctional revolution speed graph of the memory 64, which shows the relationship between the difference $\Delta L$ in the amount of size variation $\Delta\alpha$ and the amount of pitch variation $\Delta\beta$ as in $\Delta L = \Delta\alpha - \Delta\beta$ and the corrected revolution speed $\omega$ of the drive motor. The corrected revolution speed $\omega$ shows the motor revolution speed for when the drive motor revolution speed is adjusted so as to record an image after correcting the deviation in scale corresponding to the difference $\Delta L$ in the amount of size variation $\Delta\alpha$ and the amount of pitch variation $\Delta\beta$.

An operation in the second embodiment will now be explained.

Figure 9:
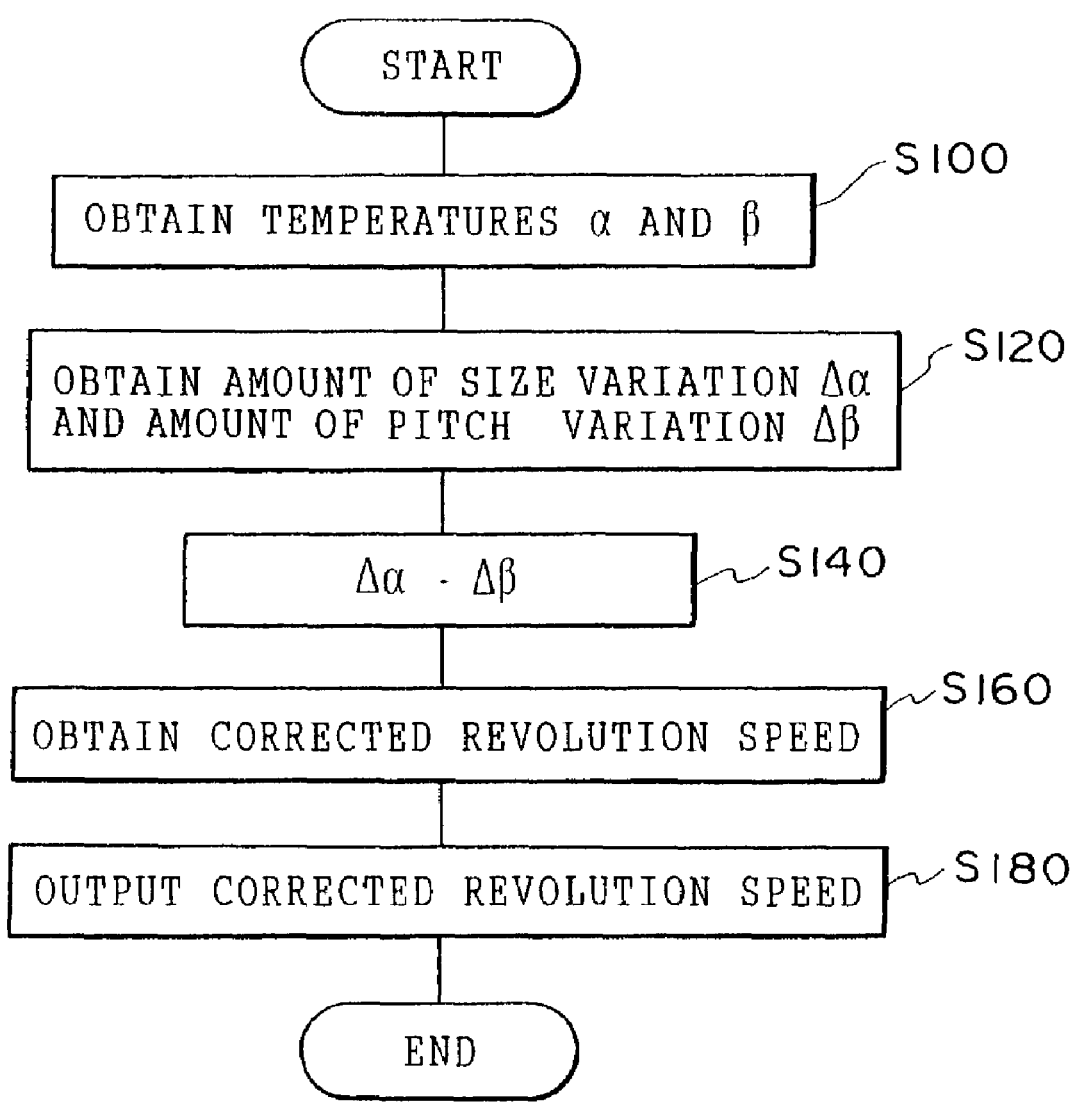
FIG. 9 is a flowchart showing a sequence of a correction process in the second embodiment of the present invention.

When a size of the printing plate precursor is inputted from an unillustrated input section to start an exposure process at the exposure device for printing plate precursors, a correction process starts at the correction section 62 in accordance with the flowchart shown in FIG. 9.

In step S100, the temperature $\alpha$ near the rotary drum 16 is outputted by the temperature sensor 40 and the temperature $\beta$ near the shaft 48 is outputted by the temperature sensor 42, and the temperature readings are obtained by the correction section 62. The temperatures of each section in the automatic exposure device for printing plate precursors differ considerably from each other, when the device is activated, especially cold. Therefore, the temperature affecting the printing plate precursor 12 is measured as the temperature $\alpha$ by the temperature sensor 40, and the temperature affecting the shaft 48 is measured as the temperature $\beta$ by the temperature sensor 42.

In step S120, the amount of size variation $\Delta\alpha$ corresponding to the temperature $\alpha$ is obtained from the table for amounts of size variation 660, and the amount of pitch variation $\Delta\beta$ corresponding to the temperature $\beta$ is obtained from the table for amounts of pitch variation 670. In step S140, the difference $\Delta L$ between the amount of size variation $\Delta\alpha$ and the amount of pitch variation $\Delta\beta$ is calculated. In step S160, the corrected revolution speed $\omega$ of the drive motor is obtained based on the calculated $\Delta L$. The corrected revolution speed $\omega$ of the drive motor is obtained referring to the graph of FIG. 8 showing the relationship between $\Delta L$ and $\omega$. In step S180, the corrected revolution speed $\omega$ of the drive motor, which has been obtained, is outputted from the correction section 62 to the drive motor 58, and then, the process is ended.

The number of drive pulses to be supplied to the drive motor 58 is adjusted so as to drive the drive motor 58 at the corrected revolution speed $\omega$ outputted from the correction section 62.

The printing plate precursor 12 is guided by an unillustrated conveyance guide unit, and sent from the tangential direction of the rotary drum 16. The rotary drum 16 is rotated at a predetermined timing by the drive motor 27 in a direction in which the printing plate precursor 12 is attached and exposed (direction of arrow A in FIG. 1). The sent printing plate precursor 12 is tightly wound around the rotary drum 16 by an unillustrated leading-edge chuck and an unillustrated trailing-edge chuck to complete the positioning of the printing plate precursor 12 for exposure. After the printing plate precursor 12 has been completely attached to the rotary drum 16, image data is read, and then, an exposure process is started with a light beam from the recording head 18. A moving speed of the recording head 18 in the sub-scanning direction at this time is corrected via the above-described correction process, so as to properly respond to the thermal expansion of the printing plate precursor and the shaft, and to form a proper image.

This exposure process is undertaken while the rotary drum 16 is rotated at high speed (main scanning) and while the recording head 18 is moved in the axial direction of the rotary drum 16 (sub-scanning).

In the second embodiment, the amounts of pitch variation of the shaft corresponding to temperature changes near the shaft, and the amounts of size variation of the printing plate precursor corresponding to temperature changes near the printing plate precursor, are respectively stored in advance in the tables for amounts of pitch/size variation, and the temperatures near the printing plate precursor and the shaft are respectively measured by the temperature sensors. Then, the amounts of pitch/size variation corresponding to the measured temperatures are respectively obtained from the tables for amounts of pitch/size variation, and the difference between the amount of pitch variation and that of size variation is calculated. Thereafter, a corrected revolution speed corresponding to the calculated difference is obtained from a graph of correctional revolution speed, so as to correct the revolution speed of the drive motor. Accordingly, an image can be properly formed in correlation to differences in image scale due to thermal expansion of the printing plate precursor and the shaft, so as to provide accurate scale and registration.

When the device is activated, especially cold, the temperature inside the device is not stable, whereby the temperature of the shaft tends to differ from that of the printing plate precursor, which subsequently causes differences in image scale. In the second embodiment, however, the temperatures near the shaft and the printing plate precursor are respectively measured so corrections can be made. Subsequently, differences in image scale due to thermal expansion of the printing plate precursor and the shaft can be properly adjusted so as to provide accurate scale and registration.

Figure 10:
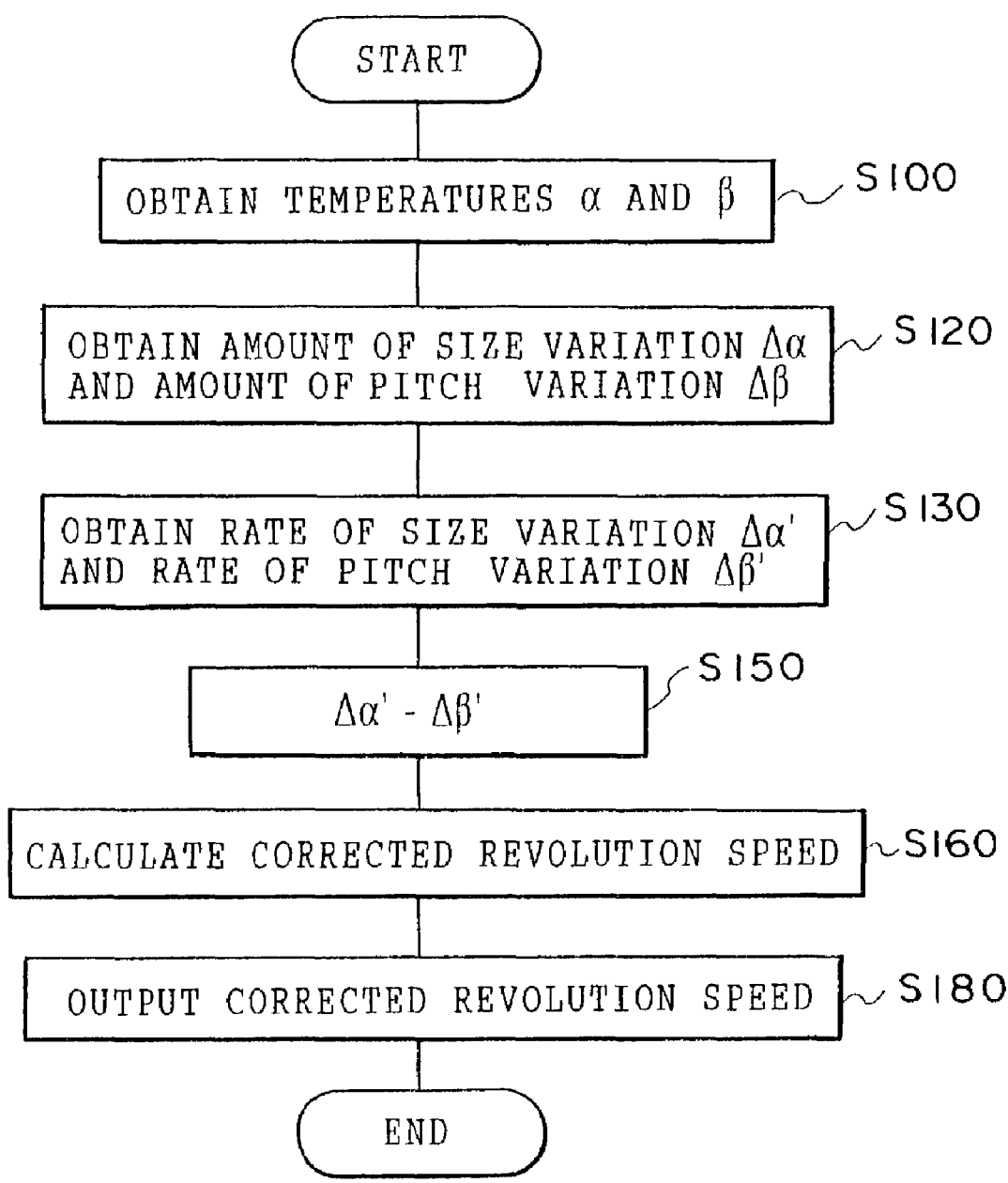
FIG. 10 is another flowchart showing the sequence of the correction process in the second embodiment of the present invention.

In the second embodiment, the differences between the amounts of pitch and size variations and their relation to the correctional revolution speed are pre-stored and shown on the correctional revolution speed graph. Corrected revolution speed is obtained from said graph. However, as shown in FIG. 10, the difference in the respective amounts of pitch and size variations can be obtained and the difference of the obtained rates can then be multiplied by a non-adjusted revolution speed, so as to calculate the revolution speed needed for forming a proper image. The drive motor is driven based on the corrected revolution speed calculations so as to adjust the moving speed of the recording head.

Further, in the second embodiment, an outer-drum type of rotary drum 16 is used as a rotating support. The same effects can be achieved, however, when an inner-drum type thereof is used as a rotating support.

In accordance with the above-described second embodiment of the present invention, the temperature near the printing plate precursor is measured by the first temperature sensor, and the temperature near the driving mechanism is measured by the second temperature sensor. The amounts of size variation of the printing plate precursor and the amounts of pitch variation of the shaft corresponding to temperature changes are stored in advance in the tables for amounts of size/pitch variations. Then, the amount of size variation of the printing plate precursor corresponding to the output from the first temperature sensor, and the amount of pitch variation of the shaft corresponding to the output from the second temperature sensor are obtained from said variation tables by the adjustment means, so as to adjust the moving speed of the recording head based on the obtained amounts of variations. Accordingly, it has the excellent effect in that an image can be properly formed in correlation to differences in image scale due to thermal expansion of the printing plate precursor and the shaft, and in that, even when the temperatures of each section in the image recording device are different from each other, the moving speed of the recording head can be properly adjusted to respond to the respective temperatures.

What is claimed is:

1. An image recording device comprising:
 a printing plate precursor;
 a rotating support including a peripheral surface around which the printing plate precursor is wound;
 a recording head disposed adjacent to the peripheral surface of the rotating support, the recording head moving parallel to an axial direction of the rotating support during rotation of the rotating support and scanning the printing plate precursor to thereby record an image on the printing plate precursor;
 a driving mechanism for moving the recording head;
 at least one temperature sensor; and
 correction means for correcting, in the axial direction of the rotating support, an image-recording start position of the recording head based on output from the temperature sensor.

2. The image recording device of claim 1, wherein the at least one temperature sensor comprises a first temperature sensor and a second temperature sensor, with the first temperature sensor measuring a temperature of the printing plate precursor and the second temperature sensor measuring a temperature of the driving mechanism.

3. The image recording device of claim 2, further comprising a correction table for storing data that represents amounts of correction of the image-recording start position of the recording head corresponding to output from the first temperature sensor and the second temperature sensor.

4. The image recording device of claim 3, wherein the correction table stores data that represents amounts of correction of the image-recording start position of the recording head per size of the printing plate precursor.

5. The image recording device of claim 1, wherein the driving mechanism includes a shaft disposed parallel to the axial direction of the rotating support for allowing the recording head to be moved along the shaft.

6. The image recording device of claim 5, wherein the shaft includes an externally threaded peripheral surface, and the driving mechanism further includes a moving block, into which the shaft is screwed to prevent axial rotation of the moving block, and a support connected to the moving block to support the recording head.

7. The image recording device of claim 6, wherein the at least one temperature sensor is disposed on the moving block to measure the temperature of the driving mechanism.

8. The image recording device of claim 5, wherein correction via the correction means is determined based on the amount of deviation of the shaft and the printing plate precursor from the predetermined image-recording start position in the axial direction of the rotating support due to temperature changes.

9. The image recording device of claim 1, wherein the correction for the image-recording start position of the recording head is based on the temperature of the printing plate precursor.

10. The image recording device of claim 1, wherein the correction for the image-recording start position of the recording head is based on the temperature of the driving mechanism.

11. An image recording device comprising:
a printing plate precursor;
a rotating support including a peripheral surface around which the printing plate precursor is wound;
a recording head disposed adjacent to the peripheral surface of the rotating support, the recording head moving parallel to an axial direction of the rotating support during rotation of the rotating support and scanning the printing plate precursor to thereby record an image on the printing plate precursor;
a driving mechanism for moving the recording head;
at least two temperature sensors; and
adjustment means for adjusting moving speed of the recording head based on output from the at least two temperature sensors.

12. The image recording device of claim 11, wherein the driving mechanism includes a shaft disposed parallel to the axial direction of the rotating support for allowing the recording head to be moved along the shaft.

13. The image recording device of claim 12, wherein the at least two temperature sensors comprise a first temperature sensor and a second temperature sensor, with the first temperature sensor measuring a temperature of the printing plate precursor and the second temperature sensor measuring a temperature of the shaft.

14. An image recording device comprising:
a printing plate precursor;
a rotating support including a peripheral surface around which the printing plate precursor is wound;
a recording head disposed adjacent to the peripheral surface of the rotating support, the recording head moving parallel to an axial direction of the rotating support during rotation of the rotating support and scanning the printing plate precursor to thereby record an image on the printing plate precursor;
a driving mechanism for moving the recording head;
at least one temperature sensor;
adjustment means for adjusting moving speed of the recording head based on output from the temperature sensor; and
variation tables for storing amounts of variations in the length of the shaft and in the dimension of the printing plate precursor corresponding to temperature changes,
wherein the driving mechanism includes a shaft disposed parallel to the axial direction of the rotating support for allowing the recording head to be moved along the shaft.

15. The image recording device of claim 14, wherein the driving mechanism includes a drive motor for rotating the shaft to move the recording head, and the variation tables further store data that represents the revolution speed of the drive motor to be corrected in correspondence to differences between the amounts of variations in the length of the shaft and in the dimension of the printing plate precursor.

16. The image recording device of claim 14, wherein the adjustment means adjusts the moving speed of the recording head based on amounts of variations obtained from the variation tables so as to correct deviation in recording scale.

17. The image recording device of claim 14, wherein the adjustment means calculates respective rates of variations in the printing plate precursor and in the shaft based on the amounts of variations obtained from the variation tables, and adjusts the moving speed of the recording head so that the moving speed has a value obtained by multiplying a difference between rates of variations in the dimension of the printing plate precursor and in the length of the shaft by a pre-adjusted moving speed of the recording head.

18. The image recording device of claim 12, wherein the shaft includes an externally threaded peripheral surface, and the driving mechanism further includes a moving block, into which the shaft is screwed to prevent axial rotation of the moving block, and a support connected to the moving block to support the recording head.

19. The image recording device of claim 18, wherein the at least one temperature sensor is disposed on the moving block to measure the temperature of the shaft.

* * * * *